United States Patent
Dunsmoor et al.

(10) Patent No.: US 12,422,683 B2
(45) Date of Patent: Sep. 23, 2025

(54) ACTIVE COOLING FOR HEAD-MOUNTED DISPLAY

(71) Applicant: APPLE INC., Cupertino, CA (US)

(72) Inventors: David J. Dunsmoor, San Jose, CA (US); Jason C. Sauers, Sunnyvale, CA (US); Sivesh Selvakumar, San Francisco, CA (US); Trevor J. Ness, Santa Cruz, CA (US)

(73) Assignee: APPLE INC., Cupertino, CA (US)

( * ) Notice: Subject to any disclaimer, the term of this patent is extended or adjusted under 35 U.S.C. 154(b) by 200 days.

(21) Appl. No.: 18/241,372

(22) Filed: Sep. 1, 2023

(65) Prior Publication Data

US 2024/0094547 A1  Mar. 21, 2024

Related U.S. Application Data

(60) Provisional application No. 63/487,273, filed on Feb. 28, 2023, provisional application No. 63/408,258, filed on Sep. 20, 2022.

(51) Int. Cl.
   *G02B 27/01* (2006.01)
   *H05K 7/20* (2006.01)

(52) U.S. Cl.
   CPC ..... *G02B 27/0176* (2013.01); *H05K 7/20172* (2013.01); *H05K 7/20181* (2013.01); *H05K 7/20209* (2013.01); *G02B 2027/0161* (2013.01)

(58) Field of Classification Search
   CPC .............. G02B 27/017; G02B 27/0176; G02B 27/0172; G02B 27/01; G02B 2027/0161; G06F 3/147; G06F 1/20; G06F 1/206; G06F 1/163; G06F 3/011; H05K 7/20181; H05K 7/20972; H05K 7/20136; H05K 7/20209; H05K 7/20172; H05K 7/20145; H05K 7/20; A42B 3/286; A42B 1/008; H04N 13/344; H04N 23/51
   See application file for complete search history.

(56) References Cited

U.S. PATENT DOCUMENTS

| | | | |
|---|---|---|---|
| 10,314,213 B2 | 6/2019 | Reynolds et al. | |
| 10,492,346 B2 | 11/2019 | Selvakumar et al. | |
| 11,131,856 B2* | 9/2021 | Gwak | G02B 27/0176 |
| 11,906,816 B2* | 2/2024 | Xie | G02C 11/08 |
| 2011/0285957 A1* | 11/2011 | Mikulenka | G02C 11/08 2/15 |
| 2014/0102442 A1 | 4/2014 | Wilson | |
| 2015/0234189 A1* | 8/2015 | Lyons | G02B 27/017 345/174 |

(Continued)

FOREIGN PATENT DOCUMENTS

CN  212723532 U  3/2021

OTHER PUBLICATIONS

CN212723532, Comfortable glasses, Liu (Year: 2021).*

*Primary Examiner* — Michael A Matey
(74) *Attorney, Agent, or Firm* — Young Basile Hanlon & MacFarlane, P.C.

(57) ABSTRACT

A head-mounted display configured to be worn on a face includes a housing, a facial interface coupled to a rear portion of the housing and configured to engage with the face, a component chamber defined in the housing, and a fan located in the component chamber and configured to create air flow from the face through the facial interface and the component chamber.

20 Claims, 11 Drawing Sheets

(56) References Cited

U.S. PATENT DOCUMENTS

| | | | |
|---|---|---|---|
| 2017/0168303 A1 | 6/2017 | Petrov | |
| 2017/0184863 A1* | 6/2017 | Balachandreswaran | ..................... G02B 27/0176 |
| 2018/0098465 A1* | 4/2018 | Reynolds | ............. G02B 27/028 |
| 2018/0103917 A1* | 4/2018 | Kim | ....................... A61B 5/291 |
| 2018/0196485 A1* | 7/2018 | Cheng | .................... G06F 1/206 |
| 2018/0307282 A1* | 10/2018 | Allin | .................. G02B 27/0176 |
| 2019/0075689 A1* | 3/2019 | Selvakumar | ......... G02B 27/017 |
| 2019/0192965 A1* | 6/2019 | Chapman | ................. A63F 13/50 |
| 2021/0216099 A1* | 7/2021 | Goodner | ............ G02B 27/0176 |
| 2021/0385954 A1* | 12/2021 | Chang | ................... H05K 5/0217 |
| 2022/0295923 A1* | 9/2022 | Hall | ................... A41D 13/1184 |
| 2022/0305302 A1* | 9/2022 | Hall | ..................... A62B 18/006 |
| 2022/0365355 A1* | 11/2022 | Li | ....................... G02B 27/0176 |

* cited by examiner

ACTIVE COOLING FOR HEAD-MOUNTED DISPLAY

CROSS-REFERENCE TO RELATED APPLICATION(S)

This application claims priority to and the benefit of U.S. Provisional Patent Application No. 63/408,258, filed Sep. 20, 2022, and claims priority to and the benefit of U.S. Provisional Patent Application No. 63/487,273, filed Feb. 28, 2023, the entire disclosures of which are incorporated by reference herein.

FIELD

The present disclosure relates generally to the field of head-mounted displays.

BACKGROUND

A head-mounted display is worn on a face and provides graphical content. The head-mounted display can generate heat during use that can cause user discomfort.

SUMMARY

A first aspect of the disclosure according to one implementation is a head-mounted display configured to be worn on a face. The head-mounted display includes a housing, a facial interface coupled to a rear portion of the housing and configured to engage with the face, a component chamber defined in the housing, and a fan located in the component chamber and configured to create air flow from the face through the facial interface and the component chamber. In various implementations, the fan directs air flow out of the housing via an opening in an upper portion of the housing.

In some aspects, the housing includes an eye chamber and a divider that separates the component chamber from the eye chamber. The divider includes an opening and the fan creates air flow from the face through the facial interface through the opening and into the component chamber.

In some aspects, the opening includes a fluid regulating component to control a flow of air through the opening between the eye chamber and the component chamber. In some aspects, the opening includes a filter configured to filter the air flow from the face to the component chamber.

In some aspects, the housing includes a passage formed in an upper portion to allow air flow between the facial interface and the component chamber. In some aspects, the passage includes a flow regulating component configured to regulate a flow of air between the face and the component chamber. In some aspects, the flow regulating component is adjustable between an open position and a closed position by an input device to regulate a flow of air from the facial interface to the component chamber.

A second aspect of the disclosure according to an implementation includes a head-mounted display configured to be worn on a face. The head-mounted display includes a housing, an eye chamber defined by the housing, a component chamber defined by the housing and separated from the eye chamber by a divider wall, and a face seal having a cover. Openings are formed through the cover to allow airflow through the face seal. The head-mounted display also includes a fan located in the component chamber and configured to draw air through the face seal and from the eye chamber through the component chamber.

In some aspects, the divider wall includes a vent, and the fan creates air flow from the face seal through the vent and into the component chamber.

In some aspects, the housing further includes an exhaust vent in an upper portion of the housing and the fan draws air from the face seal into the component chamber and out the exhaust vent.

In some aspects, the housing includes a passage formed in an upper portion of the housing to allow air flow between the face seal and the component chamber.

In some aspects, the passage includes a flow regulating component configured to regulate a flow of air between the face and the component chamber. In some aspects, the flow regulating component is adjustable between an open position and a closed position by an input device to regulate a flow of air from the face seal to the component chamber.

In some aspects, the housing further includes a sensor and the flow regulating component is adjustable between an open position and a closed position based on data from the sensor.

In some aspects, operation of the fan is controlled based on an air temperature in the eye chamber. In some aspects, operation of the fan is controlled based on a humidity level of the eye chamber.

A third aspect of the disclosure according to an implementation includes a head-mounted display configured to engage with a face. The head-mounted display includes a housing, a porous interface coupled to the housing and configured to engage with the face, and a fan located within the housing that is configured to create a negative pressure against the face by drawing air from the face through the porous interface and into the housing.

In some aspects, operation of the fan is controlled based on a skin temperature of the face.

In some aspects, the housing defines an eye chamber and a component chamber including a display and the fan is operable to create air flow from the face into the component chamber to circulate air within the component chamber.

DETAILED DESCRIPTION

The electronic components of a head-mounted display can generate heat that can cause discomfort while wearing the head-mounted display on a face. The head-mounted displays discussed herein incorporate vents, passages, fluid regulators, and an existing fan component of the optical display module assembly to draw air from the face via a porous material adjacent to the face to provide evaporative cooling.

Figure 1:
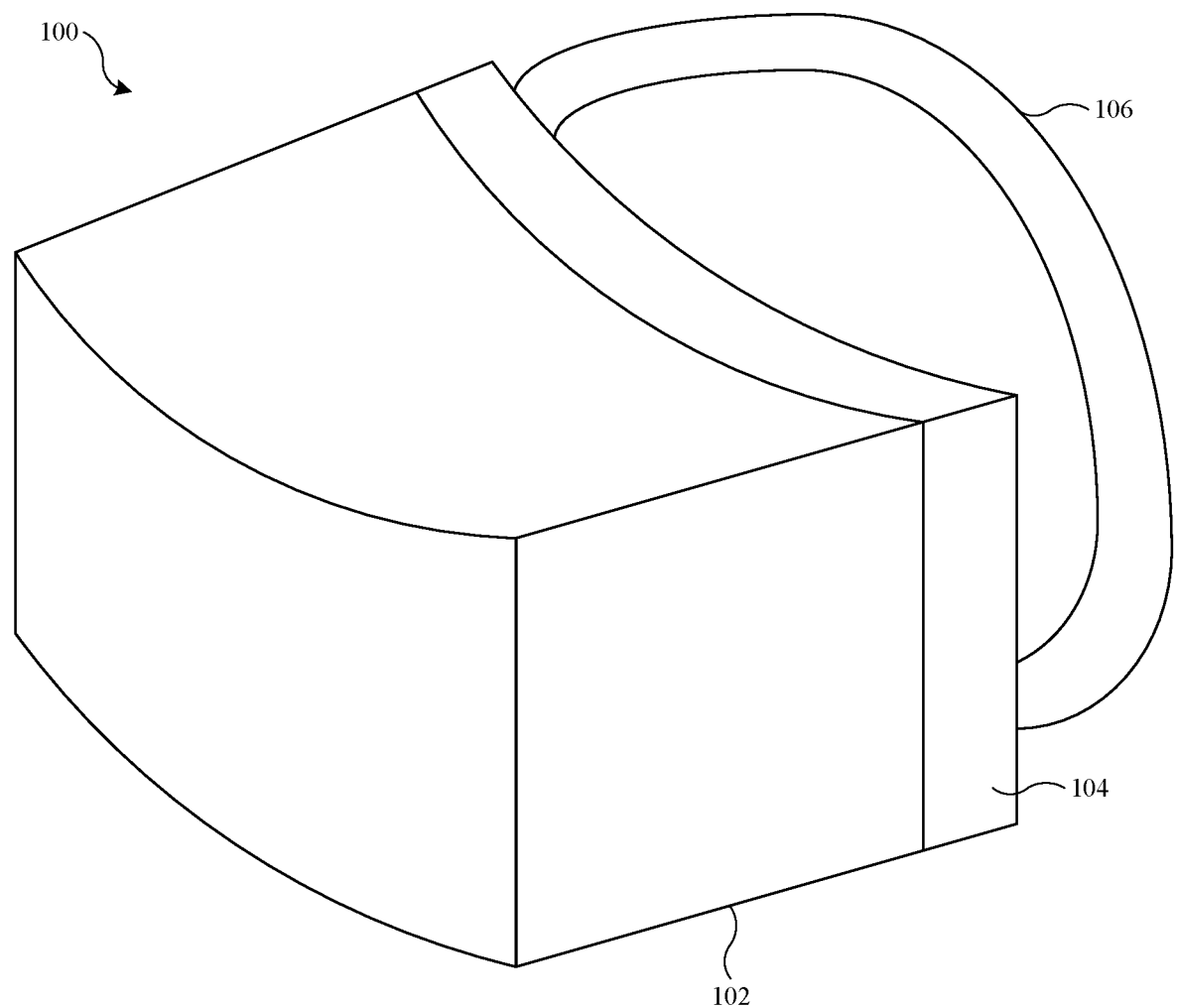
FIG. 1 is a perspective view illustration of a head-mounted display.

FIG. 1 is a perspective view illustration of a head-mounted display 100, according to an implementation. The head-mounted display 100 includes a housing 102, a facial interface 104 (e.g., gasket or face seal) coupled with the housing 102, and a securing strap 106 (e.g., a headband) connected to the housing 102 to secure the head-mounted display 100 against the face. The facial interface 104 (e.g., interface, face seal, or porous interface) is configured to engage with the face and conform to a head and face shape in the eye area of the face. The securing strap 106 is configured to support the housing 102 on the head. In the illustrated implementation, the housing 102 is a generally rectangular and/or curvilinear structure and the securing strap 106 is connected to and extends from lateral sides of the housing 102 to wrap around the head. In some implementations, the housing 102 is a unitarily formed or single-piece structure. In some implementations, the housing 102 is a multiple piece structure. In various implementations, the housing 102 is either semi-rigid or rigid and is formed from a plastic or similar material.

The head-mounted display 100 are shown and described in a "goggles" configuration; however, it should be understood that the features described with respect to the implementations shown can be utilized with head-mounted displays that have a broad range of configurations, such as, for example and without limitation, a head-mounted display 100 that includes multiple securing straps and a head-mounted display 100 having separate housings over each eye.

Figure 2:
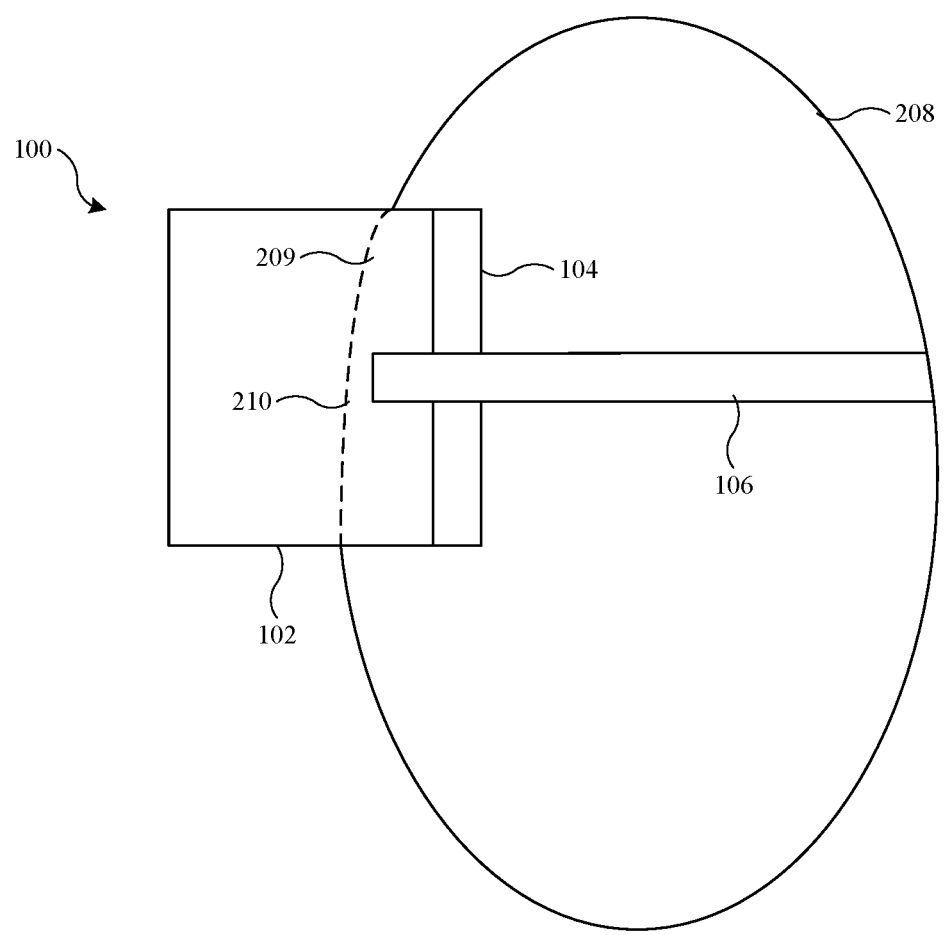
FIG. 2 is a side view illustration of the head-mounted display as worn on a face.
Figure 3:
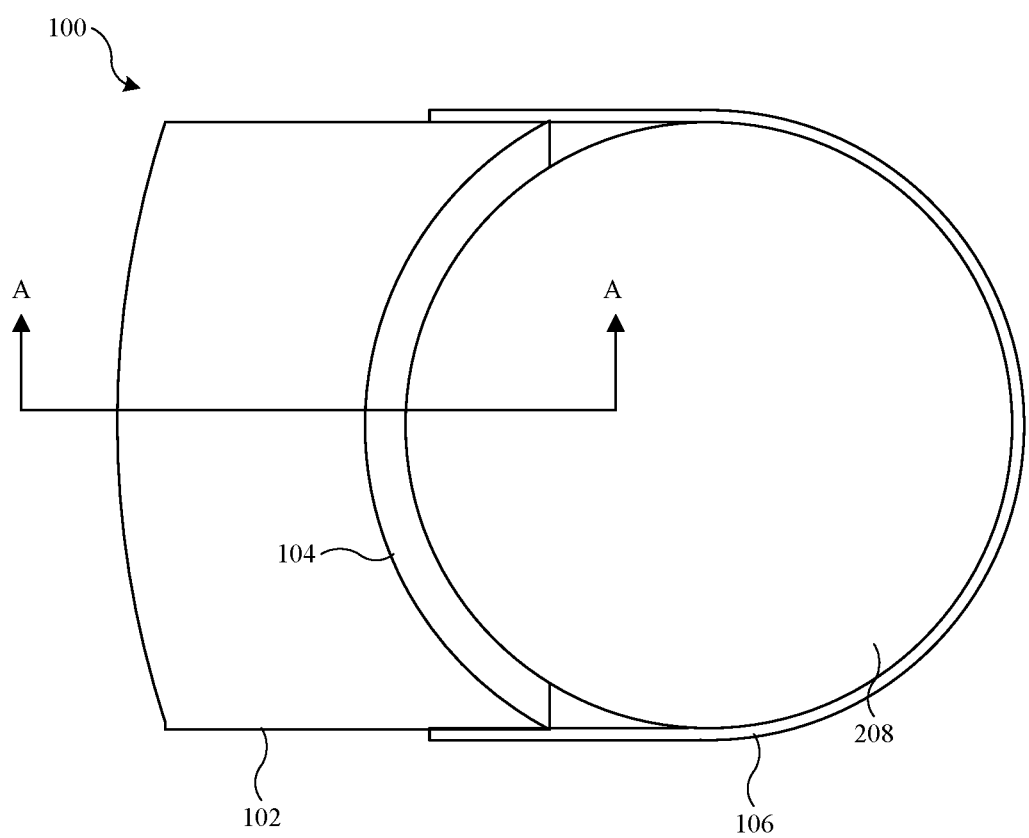
FIG. 3 is a top view illustration of the head-mounted display as worn on a face.

A side view illustration of the head-mounted display 100 as worn on a head 208 is shown in FIG. 2 and a top view illustration of the head-mounted display 100 as worn on the head 208 is shown in FIG. 3. The facial interface 104 contacts an upper portion of the face 209 of the head 208. For example, the facial interface 104 extends around an eye area 210 of the face 209 and may contact the forehead, cheeks, temples, and/or the nose of the face 209. The securing strap 106 extends peripherally around the head 208 to secure the housing 102 against the face 209. The facial interface 104 is configured to engage with the face 209 such that air can be drawn away from the face 209 to create a cooling effect, as discussed herein. In some implementations, the facial interface 104 is made from a phase changing material to provide passive cooling on the face 209.

Figure 4:
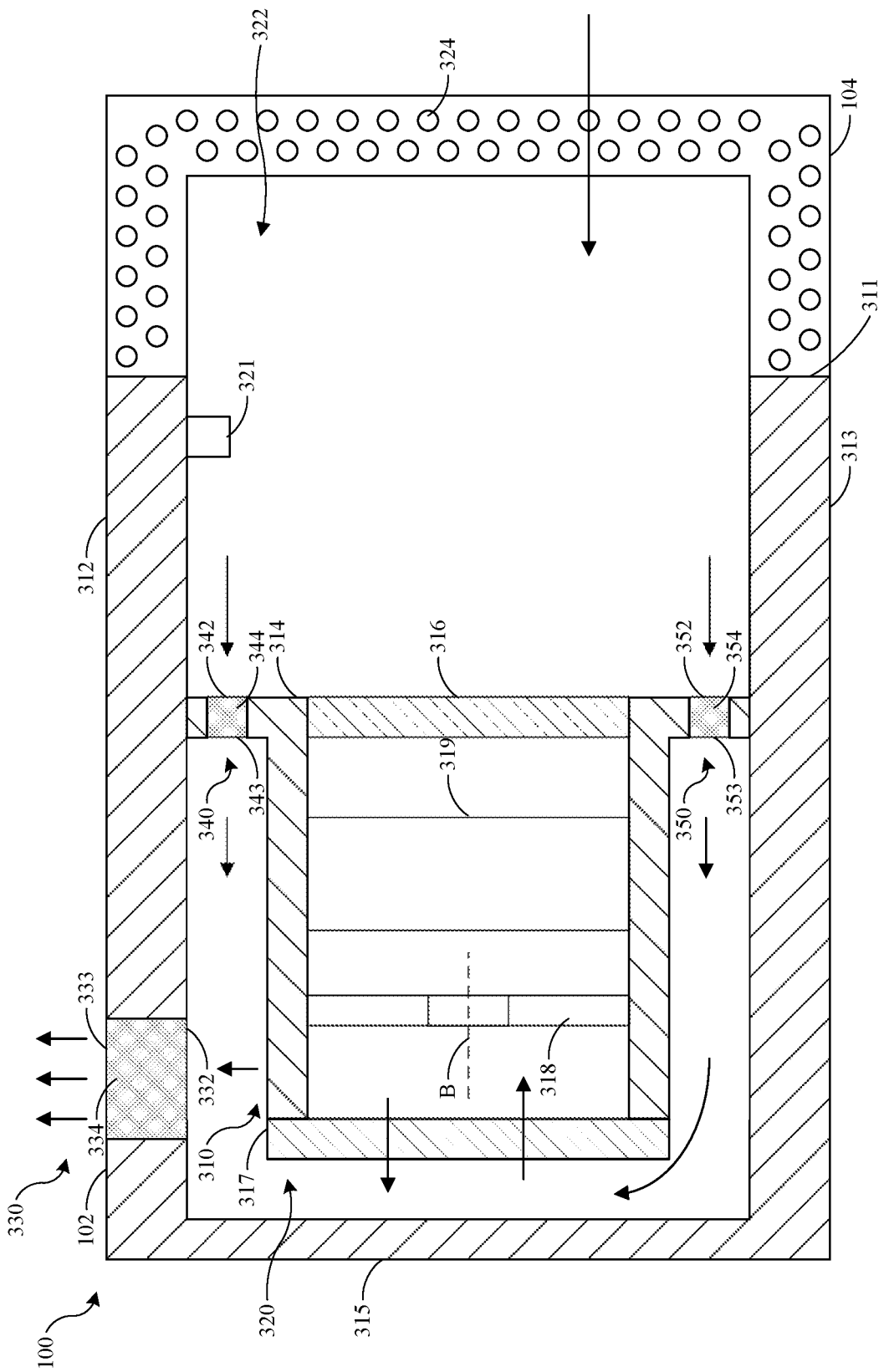
FIG. 4 is a side cross-section view illustration of the head-mounted display of FIG. 1 taken along line A-A of FIG. 3, according to a first implementation.

FIG. 4 is a side cross-section view illustration of the head-mounted display of FIG. 1 taken along line A-A of FIG. 3, according to a first implementation. The head-mounted display 100 includes the housing 102 which encloses an optical module assembly 310. The housing 102 includes a rear portion 311, an upper portion 312, a lower portion 313, a divider portion 314 (e.g., divider wall), and a front portion 315. The divider portion 314 connects the upper portion 312 and the lower portion 313. The rear portion 311, the upper portion 312, the lower portion 313, the divider portion 314, and the front portion 315 may be a single part or may be multiple parts coupled together. In various implementations, all or part of the housing 102 may be rigid or semi-rigid and have varying material properties such that some portions are rigid and some are flexible.

The optical module assembly 310 includes lenses 316 (two lenses that are each paired with an eye), a display 317, a fan 318, and electronic components 319. The housing 102 defines a component chamber 320 in which to support and/or enclose portions of the head-mounted display 100 that include electronic components such as the optical module assembly 310.

The housing 102 also defines an eye chamber 322. The component chamber 320 and the eye chamber 322 are divided by the divider portion 314, that is, the divider portion 314 is a divider or divider wall that separates the component chamber 320 from the eye chamber 322. The component chamber 320 is defined by the front portion 315, the upper portion 312, the lower portion 313, and an internally-facing side of the divider portion 314. The component chamber 320 at least partially encloses the optical module assembly 310 including the lenses 316, the display 317, the fan 318, and the electronic components 319.

An opposite side of the divider portion 314 is exposed to the exterior and is adjacent to the eye chamber 322. The eye chamber 322 is defined by the housing 102 between the upper portion 312, the lower portion 313, the divider portion 314, and the facial interface 104. The facial interface 104 extends around all or part of the housing 102 adjacent to the rear portion 311. The rear portion 311 provides a support surface for the facial interface 104. In various implementations, other components, such as sensors 321, may be formed on or supported by the housing 102. The sensors 321 may be located within the component chamber 320 and/or within the eye chamber 322 to provide data regarding conditions within the component chamber 320 and/or the eye chamber 322 such as, for example, an air temperature within the component chamber 320, an air temperature within the eye chamber 322, a humidity level within the component chamber 320, and a humidity level within the eye chamber 322.

When the head-mounted display 100 is positioned on the face 209, the eye chamber 322 is positioned adjacent to the eye area 210. Engagement of the facial interface 104 with the face 209 reduces or eliminates an amount of environmental light from outside the housing 102 and the facial interface 104 that could otherwise enter the eye chamber 322. The facial interface 104 includes perforations 324 (e.g., openings formed through a cover to allow airflow through the facial interface) that create a porous membrane that is configured to engage with and contacts the skin of the face 209. In various implementations, the perforations 324 of the facial interface 104 allow airflow between the face 209 and the housing 102 due to the air circulation effect of the fan 318 that draws air from the face 209 through the facial interface 104 via the perforations 324 and into the housing 102, as described in further detail herein.

In various implementations, the perforations 324 of the facial interface 104 allow airflow into the gasket formed by the facial interface 104 but do not allow airflow into the eye chamber 322. The airflow is instead routed through the facial interface 104 and into the component chamber 320. In various implementations, as discussed in greater detail herein, the airflow can travel through the facial interface 104 and within the upper portion 312 and/or the lower portion 313 of the housing 102 such that the air flows into the component chamber 320.

The divider portion 314 indirectly or directly supports components of the optical module assembly 310. As shown, the divider portion 314 directly supports the lenses 316. In other implementations, the lenses 316 are indirectly supported by the divider portion 314, such as by an interpupillary distance adjustment mechanism that is operable to laterally move a position of the lenses 316 relative to each other. Additionally, in various implementations, the lenses 316 may be supported by a mechanism that moves the lenses 316 to adjust a distance between the lenses 316 and eyes of the face 209. The lenses 316 focus, reshape, and/or redirect light emitted as images from the display 317.

The component chamber 320 is a substantially enclosed space formed by the internally facing side of the divider portion 314 and the housing 102. In various implementations, multiple component chambers are defined by the housing 102. In the illustrated implementation, the display 317, the fan 318, and the electronic components 319 are located within the component chamber 320. The display 317, the fan 318, and the electronic components 319 may be supported by the divider portion 314 as shown or may be supported by other structures of the housing 102 located within the component chamber 320.

The electronic components 319 include components that generate or receive content, in the form of signals or data, and transmit the content to the display 317 to be output for display as emitted light. The content may be computer-generated reality content as will be described. The electronic components 319 may include sensors that detect conditions within the component chamber 320 such as temperature, humidity, and position and orientation of the head-mounted display 100.

The electronic components 319 may generate heat that can build up within the component chamber 320 and be transmitted to the face 209 via the housing 102 and the facial interface 104. The fan 318 is operable to generate airflow within the component chamber 320 to dissipate the heat generated by the electronic components 319. The fan 318 includes one or more blades or air moving components (not shown) that rotates about a rotation axis B to generate airflow within the housing 102 and to draw air from the face 209 via the facial interface 104.

During operation of the head-mounted display 100, heat generated by the optical module assembly 310 can cause discomfort that is felt on the face 209. To reduce heat levels and cool the skin on the face 209, the fan 318 is operable to draw air from the face 209 via the perforations 324 of the facial interface 104. Drawing air from the face 209 creates a negative pressure which in turn creates an evaporative cooling effect on the face 209. In various implementations, the fan 318 includes a propulsion component such as an electric motor and one or more air moving components such as fan blades. In various implementations, the head-mounted display 100 includes other thermal regulation components that can be utilized to draw air from the face 209 via the facial interface 104, control a temperature within the eye chamber 322, and reduce the heat felt on the face 209, as well as to reduce air and component temperatures within the component chamber 320.

In the illustrated implementation shown in FIG. 4, the thermal regulation components include an exhaust vent 330. The exhaust vent 330 is a passive component that allows air to exit the housing 102. The exhaust vent 330 is an opening that extends through the upper portion 312 of the housing 102 and includes an inlet 332 formed in the upper portion 312 of the housing 102. The inlet 332 is in communication with the component chamber 320 to receive air from the component chamber 320 due to the rotation of the fan 318. The exhaust vent 330 also includes an outlet 333 on an exterior surface of the upper portion 312 to expel air from the component chamber 320 and the housing 102 to the environment. The outlet 333 may be an opening formed in the upper portion 312 of the housing 102. In various implementations, a filter 334 is positioned between the inlet 332 and the outlet 333 to filter the air and prevent an incursion of particles (e.g., dust) from the environment into the component chamber 320 and the housing 102. In various implementations, the filter 334 may be a layer of fabric or other material configured to reduce entry of foreign particles into the housing 102. The fan 318 directs air flow out of the housing 102 via the exhaust vent 330 and directs air flow into the housing 102 as discussed herein and illustrated by the arrows in FIG. 4 that illustrate air flow from the facial interface 104 to the housing 102 and out of the housing 102.

To enable additional airflow within the housing 102 and away from the face 209, the thermal regulation components of the head-mounted display 100 shown in FIG. 4 also include openings that extend through the divider portion 314. In the illustrated implementation, these openings include an upper divider vent 340 and a lower divider vent 350. As shown in FIG. 4, the upper divider vent 340 and the lower divider vent 350 are passive components that permit airflow between the face 209 via the facial interface 104 and the eye chamber 322 and the component chamber 320. In the illustrated implementation, the upper divider vent 340 is above the lenses 316 and the lower divider vent 350 is below the lenses 316. While two vents in the divider portion 314 are illustrated in FIG. 4, it is understood that a single vent or more than two vents may be positioned in the divider portion 314.

The upper divider vent 340 is an opening that extends through the divider portion 314 and includes an inlet 342 in direct communication with the eye chamber 322 to receive air from the eye chamber 322 and the facial interface 104. The inlet 342 may be formed as an opening in the divider portion 314. The upper divider vent 340 also includes an outlet 343 in direct communication with the component chamber 320 to dispel air from the eye chamber 322 into the component chamber 320. The outlet 343 may be similarly formed as an opening in the divider portion 314. The air dispelled into the component chamber 320 through the upper divider vent 340 is circulated throughout the component chamber 320 by the fan 318 and is directed out of the housing 102 via the exhaust vent 330.

As shown in FIG. 4, in various implementations, a filter 344 is positioned within the upper divider vent 340 between the inlet 342 and the outlet 343 to filter the air flow between the face 209 and the component chamber 320. The filter 344 is similar to the filter 334 and includes a layer of fabric or other filtering material to prevent dust or other foreign particles from entering the component chamber 320.

In various implementations, the lower divider vent 350 is similar to the upper divider vent 340 discussed herein. The lower divider vent 350 is an opening that extends through the divider portion 314 of the housing 102 and is positioned below the lenses 316 as shown. The lower divider vent 350 includes an inlet 352 that is formed as an opening in the divider portion 314 and is in direct communication with the eye chamber 322 to receive air from the eye chamber 322 and the facial interface 104.

The lower divider vent 350 also includes an outlet 353 in direct communication with the component chamber 320 to dispel air from the eye chamber 322 into the component chamber 320. The outlet 353 may be similarly formed as an opening or gap in the divider portion 314. The air dispelled into the component chamber 320 through the lower divider vent 350 is circulated throughout the component chamber 320 by the fan 318 and is directed out of the housing 102 via the exhaust vent 330.

In various implementations, a filter 354 is positioned within the lower divider vent 350 between the inlet 352 and the outlet 353. The filter 354 is similar to the filter 334 and the filter 344. The filter 354 includes, in some implementations, a layer of fabric or other filtering material to prevent dust or other foreign particles from entering the component chamber 320.

Rotation of the fan 318 around the rotation axis B draws air from the face 209 through the facial interface 104 and from the eye chamber 322 to create air flow from the face through the facial interface 104 and into the component chamber 320. The air is drawn into the component chamber 320 via the upper divider vent 340 and the lower divider vent 350. The fan 318 circulates the air within the component chamber 320 to dispel heat generated by the display 317 and the electronic components 319. The heated air is then expelled from or directed by the fan 318 out of the component chamber 320 via the exhaust vent 330.

The air flow created by rotation of the fan 318 results in air being drawn from the face 209 via the facial interface 104. The air flow away from the face 209 creates a negative pressure against the face 209. The negative pressure creates a localized evaporative cooling effect on the face 209 to provide increased comfort during use of the head-mounted display 100, as the electronic components 319 may generate heat that creates thermal discomfort. Drawing air away from the face 209 prevents discomfort that may be caused when air is directed against the face 209, such as dryness, for example.

Control of the thermal regulation components of the head-mounted display 100 can be based on the sensor data provided by one or more sensors, such as the sensors 321, positioned within the housing 102. The sensors 321 are positioned and configured to generate data regarding the thermal condition and/or a humidity level at positions within the housing 102, such as the component chamber 320 and/or the eye chamber 322.

The fan 318 can be controlled to achieve desired thermal characteristics, such as evaporative cooling on the face 209 and/or circulation of air and cooling of the display 317 and/or the electronic components 319. In various implementations, the fan 318 is operated and controlled based on data from the sensors 321, such as a detected air temperature of the eye chamber 322, a humidity level of the eye chamber 322, a detected air temperature of the component chamber 320, a detected temperature of the electronic components 319, or other factors, such as battery use by the electronic components 319. For example, an air temperature of the eye chamber 322 may be detected by a temperature sensor positioned within the eye chamber 322. In other implementations, a humidity level of the eye chamber 322 can be detected by a humidity sensor positioned within the eye chamber 322.

In other implementations, the sensors 321 can be used to measure characteristics that are indicative of user comfort and the fan 318 may be operated based on characteristics that indicate user discomfort. For example, infrared sensors may be used to measure a skin temperature of the face 209 or may be used to detect perspiration on the skin of the face 209, and operation of the fan 318 may be controlled based on the skin temperature of the face 209 or based on the presence of perspiration on the face 209. Some implementations of the head-mounted display 100 include air flow sensors positioned in the housing 102. In various implementations, one or more air flow sensors may be positioned at the inlet 332 of the exhaust vent 330, at the inlet 342 of the upper divider vent 340, and/or at the inlet 352 of the lower divider vent 350. The air flow sensors may be used to control and establish a desired air flow from the face 209 and the eye chamber 322 to the component chamber 320 and to the external environment.

The fan 318 may be controlled based on data from the sensors 321 that indicate user discomfort or that indicate thermal conditions within the housing 102 to circulate air within the housing 102 and to draw air through the facial interface 104. Operation of the fan 318 causes warm or heated air to be expelled from the component chamber 320 by directing air flow out of the housing 102 via the exhaust vent 330. The air flow causes air from the eye chamber 322 to be drawn into the component chamber 320 via the upper divider vent 340 and the lower divider vent 350. The flow of air away from the facial interface 104 and the eye chamber 322 creates negative pressure on the face 209 which creates an evaporative cooling effect on the face 209. Additionally, the air flow into and out of the component chamber 320 removes heated air from the component chamber 320 to assist in cooling the electronic components 319.

Figure 5:
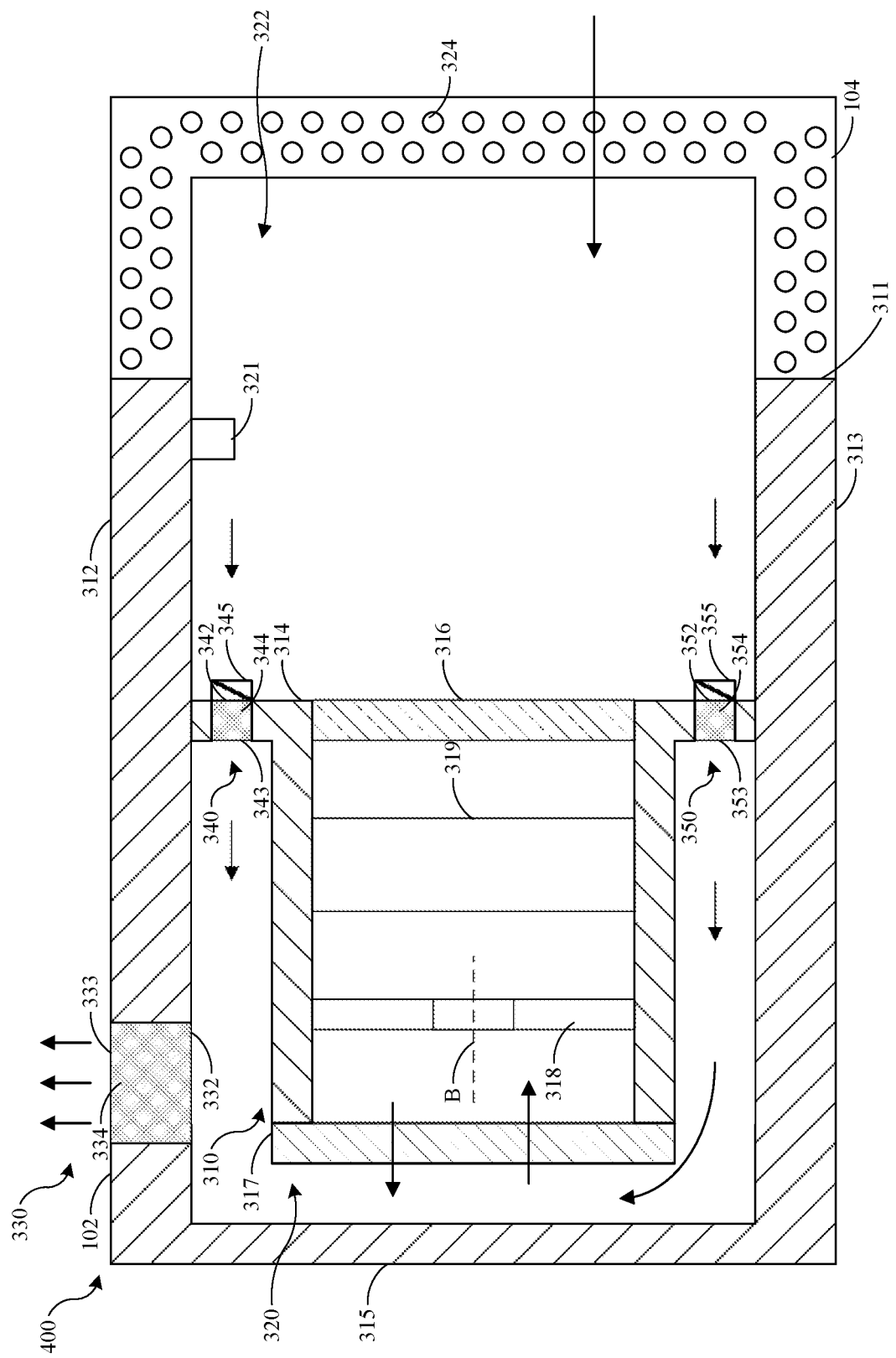
FIG. 5 is a side cross-section view illustration of the head-mounted display of FIG. 1 taken along line A-A of FIG. 3, according to a second implementation.

FIG. 5 is a side cross-section view illustration of a head-mounted display 400 taken along the line A-A as shown in FIG. 3, according to a second implementation. The head-mounted display 400 illustrated in FIG. 5 is similar to the head-mounted display 100 illustrated in FIG. 4 with the addition of fluid regulating components that include a valve 345 positioned adjacent to the upper divider vent 340 and a valve 355 positioned adjacent to the lower divider vent 350. The fluid regulating components control a flow of air through the openings between the eye chamber 322 and the component chamber 320.

The head-mounted display 400 includes the housing 102, the facial interface 104 including the perforations 324, the rear portion 311 that supports the facial interface 104, the upper portion 312, the lower portion 313, the divider portion 314, the front portion 315, lenses 316, display 317, fan 318, electronic components 319, component chamber 320, sensors 321, and eye chamber 322, all of which are analogous to the components of the head-mounted display 100.

The thermal regulation components of the head-mounted display 400 include the exhaust vent 330, the upper divider vent 340, and the lower divider vent 350. Air flow through the upper divider vent 340 is regulated by the valve 345. Similarly, air flow through the lower divider vent 350 is regulated by the valve 355. The valve 345 and the valve 355 are flow regulating components of any design and may be electronically controlled to regulate the flow of air through one or both of the upper divider vent 340 and the lower divider vent 350. The valve 345 is controllable to allow flow through the upper divider vent 340 between a fully open position that permits unregulated air flow through the upper divider vent 340 and a fully closed position which permits no air flow through the upper divider vent 340. In various implementations, the valve 345 is proportionally controlled to allow various degrees of air flow through the upper divider vent 340 between the fully open position of the valve 345 and the fully closed position of the valve 345. Similarly, the valve 355 is controllable to allow flow through the lower divider vent 350 between a fully open position that permits unregulated air flow through the lower divider vent 350 and a fully closed position which permits no air flow through the lower divider vent 350. In various implementations, the valve 355 is proportionally controlled to allow various degrees of air flow through the lower divider vent 350 between the fully open position of the valve 355 and the fully closed position of the valve 355. Control of the valve 345 and the valve 355 may be based on data from the sensors 321 positioned within the housing 102 that are configured to detect various thermal characteristics or conditions within the housing 102, such as an air temperature of the component chamber 320, the air temperature of the eye chamber 322, perspiration on the face 209, and the humidity of the eye chamber 322, as discussed with respect to the head-mounted display 100. While not shown in FIG. 5, in various implementations, another flow regulating component such as a valve may be positioned at the inlet 332 or the outlet 333 of the exhaust vent 330 and may be operated similarly to the operation of the valve 345 and the valve 355.

Control of the fan 318 of the head-mounted display 400 is analogous to the control of the fan 318 as discussed with respect to the head-mounted display 100 to draw air away from the face 209 via the facial interface 104 and the eye chamber 322 to create a cooling effect on the face 209. As discussed herein with respect to the head-mounted display 100, the fan 318 operates to circulate air within and direct or expel air from the housing 102 and the component chamber 320 via the exhaust vent 330.

Figure 6:
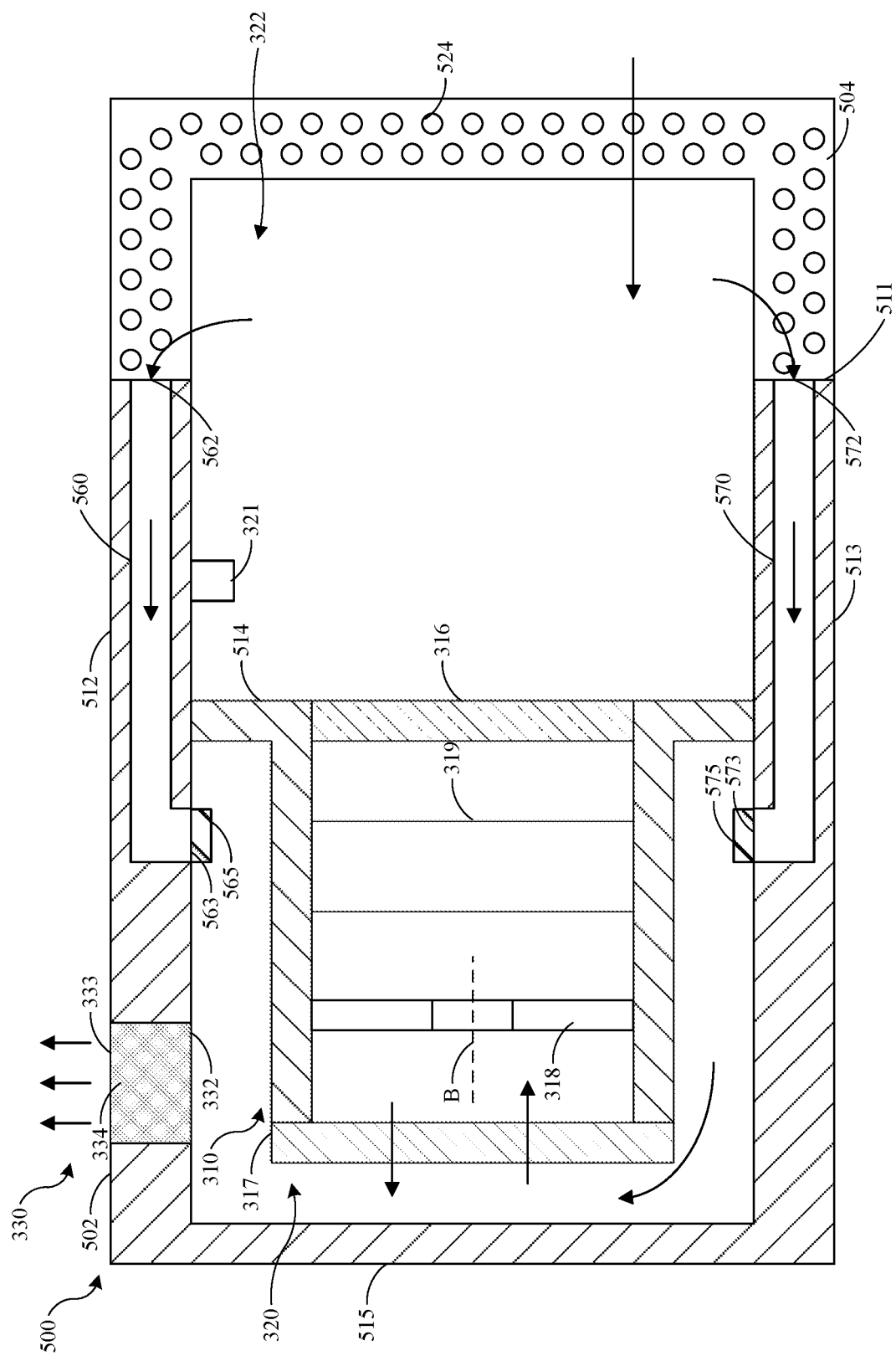
FIG. 6 is a side cross-section view illustration of the head-mounted display of FIG. 1 taken along line A-A of FIG. 3, according to a third implementation.

A cross-section illustration of a head-mounted display 500 according to another implementation is shown in FIG. 6. The head-mounted display 500 is similar to the head-mounted display 100 illustrated in FIG. 4 except as discussed herein.

The head-mounted display 500 includes a housing 502, a facial interface 504, a rear portion 511, an upper portion 512, a lower portion 513, a divider portion 514, a front portion 515, the lenses 316, the display 317, the fan 318, the electronic components 319, the component chamber 320, the sensors 321, the eye chamber 322, and the exhaust vent 330 which are analogous to the similarly named components discussed with respect to the head-mounted display 100.

The head-mounted display 500 directs air from and through the facial interface 504 through passages formed in the housing 102 to the component chamber 320. In some implementations, air is directed through the facial interface 504 into the eye chamber 322 and then into the passages formed in the housing 102. In other implementations, air is directed within the facial interface 104 to the passages formed in the housing 102. An upper passage 560 extends through the upper portion 512 of the housing 102 between an inlet 562 positioned adjacent to the facial interface 504 and an outlet 563 positioned adjacent to the component chamber 320. The inlet 562 is formed as an opening in the rear portion 511 adjacent to the facial interface 504. The outlet 563 is formed as an opening in the upper portion 512 of the housing 102. The upper passage 560 enables air flow between the facial interface 504 and the component chamber 320.

Similarly, a lower passage 570 extends through the lower portion 513 of the housing 102 between an inlet 572 positioned adjacent to the facial interface 504 and an outlet 573 positioned adjacent to the component chamber 320. The inlet 572 is formed as an opening in the rear portion 511 adjacent to the facial interface 504. The outlet 573 is formed as an opening in the lower portion 513 of the housing 102. The lower passage 570 enables air flow between the facial interface 504 and the component chamber 320.

In the illustrated implementation, the head-mounted display 500 includes fluid regulating components positioned in the upper passage 560 and the lower passage 570 to regulate air flow through the upper passage 560 and the lower passage 570. As shown, a valve 565 is positioned at the outlet 563 of the upper passage 560. Similarly, a valve 575 is positioned at the outlet 573 of the lower passage 570. The valve 565 and valve 575 can be controlled to various positions between and including a fully open position and a fully closed position to regulate the flow of air between the facial interface 504 and the component chamber 320 similar to the control of the valve 345 and the valve 355 discussed with respect to the head-mounted display 400. Control of the valve 565 and the valve 575 can be based on sensor data from one or more sensors 321 positioned within the housing 102 as discussed with respect to the head-mounted display 100. Control and operation of the fan 318 is analogous to the control and operation of the fan 318 described with respect to the head-mounted display 100.

The upper passage 560 and the lower passage 570 are positioned adjacent to the facial interface 504 to enable air to be pulled from the face 209 through the perforations 524 in the facial interface 504 to create an evaporative cooling effect on the face 209 when operation of the head-mounted display 500 generates heat that can cause discomfort. Additionally, the fan 318 draws air through the upper passage 560 and the lower passage 570 away from the face 209 such that air flow is directed away from the face 209 and the eye area 210 to prevent eye dryness due to air flow directed at the face 209. The negative pressure generated by the flow of air from the facial interface 504 to the component chamber 320 creates a cooling effect on the face 209 and reduces humidity and perspiration on the face 209. The fan 318 also directs air within the component chamber 320 as discussed herein with respect to the head-mounted display 100 to cool the display 317 and the electronic components 319. Operation of the fan 318 causes warm air to be expelled from the component chamber 320 of the housing 502 via the exhaust vent 330 which operates as discussed herein with respect to the head-mounted display 100.

Figure 7:
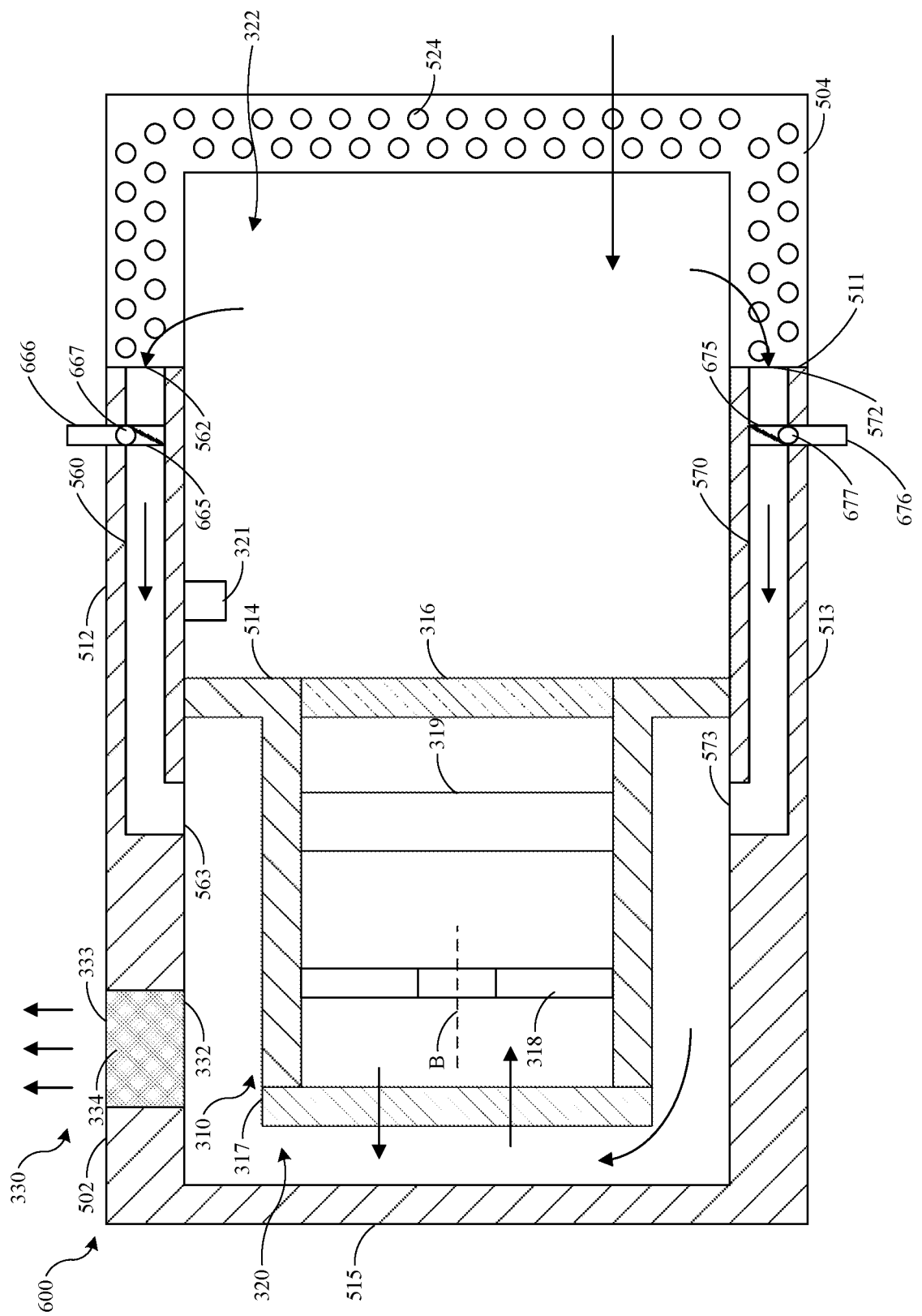
FIG. 7 is a side cross-section view illustration of the head-mounted display of FIG. 1 taken along line A-A of FIG. 3, according to a fourth implementation.

A side cross-section view illustration of a head-mounted display 600 is shown in FIG. 7. The head-mounted display 600 is similar to the head-mounted display 500 discussed with respect to FIG. 6 except as described herein.

Similar to the head-mounted display 500, the head-mounted display 600 includes the upper passage 560 and the lower passage 570 to enable air flow from the facial interface 504 and the component chamber 320. The thermal regulation components of the head-mounted display 600 include the fan 318, which is operated and controlled as described with respect to the head-mounted display 100, and the exhaust vent 330. The thermal regulation components of the head-mounted display 600 also include flow regulating components to regulate air flow through the upper passage 560 and the lower passage 570. The flow regulating components include a valve 665 positioned in the upper passage 560 and a valve 675 positioned in the lower passage 570.

The valve 665 is adjustable and configured to be manipulated between a closed position to an open position via an input device 666. The input device 666 is configured to receive an input, for example, a user input, regarding a desired air flow through the valve 665. The input device 666 is coupled with the valve 665, either mechanically or electronically, such that the position of the valve 665 is adjusted based on the input to the input device 666. The input device 666 can be any device configured to receive a user input or be manipulated by a user, such as a button, switch, slider, joystick, touchscreen input, etc., for example and without limitation. The input device 666 is coupled, mechanically or electronically, with the valve 665 to change a position of the valve 665, such as to any position between and including a fully open position and a fully closed position. In the illustrated implementation, the input device 666 is coupled with a rotation member 667 (e.g., a pin) that enables rotation of the valve 665 due to movement of the input device 666, such as a side to side or forward to back movement of a slider or joystick. The input device 666 can be manipulated by a user to regulate the amount of air flow from the facial interface 504 to the component chamber 320 via the upper passage 560. While the valve 665 is illustrated as opening due to rotation of the rotation member 667, it is understood that the valve 665 can be manipulated between an open position and a closed position by any manually adjustable mechanism (e.g., a slider) to allow airflow through the valve 665. In some implementations, the valve 665 can be manually controlled or electronically controlled to regulate the flow of air through the valve 665.

Similarly, the valve 675 is configured to be manipulated to any position between and including a closed position and an open position via an input device 676. The input device 676 is coupled with the valve 675 via a rotation member 677 (e.g., a pin) that enables rotation of the valve 675 due to movement of the input device 676, such as a side to side or forward to back movement. The input device 676 can be manipulated by a user to regulate the amount of air flow from the facial interface 504 to the component chamber 320 via the lower passage 570. Similarly, while the valve 675 is illustrated as opening due to rotation of the rotation member 677, it is understood that the valve 675 can be manipulated between an open position and a closed position by any manually adjustable mechanism (e.g., a slider) to allow airflow through the valve 675. In some implementations, the valve 675 can be manually controlled or electronically controlled to regulate the flow of air through the valve 675.

Figure 8:
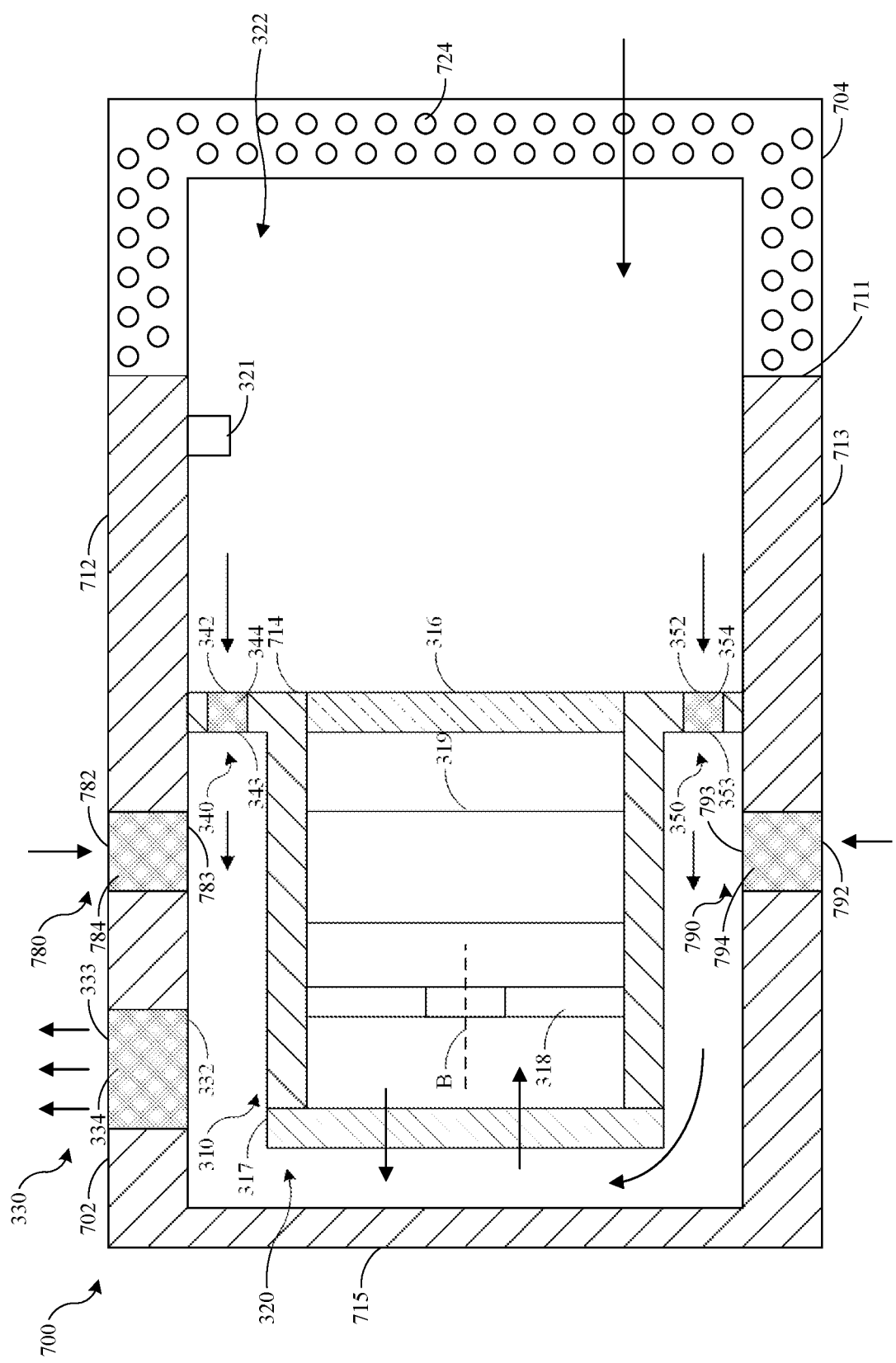
FIG. 8 is side cross-section view illustration of the head-mounted display of FIG. 1 taken along line A-A of FIG. 3, according to a fifth implementation.

FIG. 8 is a side cross-section view illustration of a head-mounted display 700 that is similar to the head-mounted display 100 shown in FIG. 4 except as described herein. The head-mounted display 700 includes a housing 702, a facial interface 704 including perforations 724 that is coupled to a rear portion 711 of the housing 702, an upper portion 712, a lower portion 713, a divider portion 714 extending between the upper portion 712 and the lower portion 713, and a front portion 715. The head-mounted display 700 also includes lenses 316, display 317, electronic components 319, the component chamber 320, the sensors 321, and the eye chamber 322, all of which are analogous to similarly designated components of the head-mounted display 100.

The thermal regulation components of the head-mounted display 700 include the fan 318, which is operated and controlled as described with respect to the head-mounted display 100, and the exhaust vent 330 which enables an outflow of air from the component chamber 320 as directed by the fan 318 and as described with respect to the head-mounted display 100. The head-mounted display 700 also includes the upper divider vent 340 and the lower divider vent 350, each of which enable a flow of air from the facial interface 704 and the eye chamber 322 to the component chamber 320.

The head-mounted display 700 also includes an upper housing vent 780 and a lower housing vent 790 as additional thermal regulation components. The upper housing vent 780 extends through the upper portion 712 of the housing 702 and includes an inlet 782 to draw air from the environment into the component chamber 320. The inlet 782 may be formed as an opening in the upper portion 712. The upper housing vent 780 also includes an outlet 783 in direct communication with the component chamber 320 to dispel air received from the environment into the component chamber 320. The outlet 783 may be similarly formed as an opening in the upper portion 712 of the housing 702. The air dispelled into the component chamber 320 through the upper housing vent 780 is circulated throughout the component chamber 320 by the fan 318 to assist with cooling the components of the optical module assembly 310 including the electronic components 319 and is expelled from the housing 702 via the exhaust vent 330.

As shown in FIG. 8, in various implementations, a filter 784 is positioned within the upper housing vent 780 between the inlet 782 and the outlet 783. The filter 784 is similar to the filter 334 and the filter 344 discussed herein and includes a layer of fabric or other filtering material to prevent dust or other foreign particles from entering the component chamber 320.

The lower housing vent 790 extends through the lower portion 713 of the housing 702 and includes an inlet 792 to draw air from the environment into the component chamber 320. The inlet 792 may be formed as an opening in the lower portion 713 of the housing 702. The lower housing vent 790 also includes an outlet 793 in direct communication with the component chamber 320 to dispel air received from the environment into the component chamber 320. The outlet 793 may be similarly formed as an opening in the lower portion 713 of the housing 702. The air dispelled into the component chamber 320 through the lower housing vent 790 is circulated throughout the component chamber 320 by the fan 318 to assist with cooling the components of the optical module assembly 310 and is expelled from the housing 702 via the exhaust vent 330.

In some implementations, a filter 794 is positioned within the lower housing vent 790 between the inlet 792 and the outlet 793. The filter 794 is similar to the filter 334 and the filter 344 discussed herein and includes a layer of fabric or other filtering material to prevent dust or other foreign particles from entering the component chamber 320.

While not shown in FIG. 8, it is understood that one or both of the upper housing vent 780 and the lower housing vent 790 may include fluid regulation components such as a valve to regulate air flow into the component chamber 320. In various implementations, the fluid regulation component may be an electronically controlled valve similar to the valve 345 or the valve 355 as described herein with respect to the head-mounted display 400. In various implementations, the fluid regulation component may be a user-controlled valve similar to the valve 665 or the valve 675 as described herein with respect to the head-mounted display 600.

Figure 9:
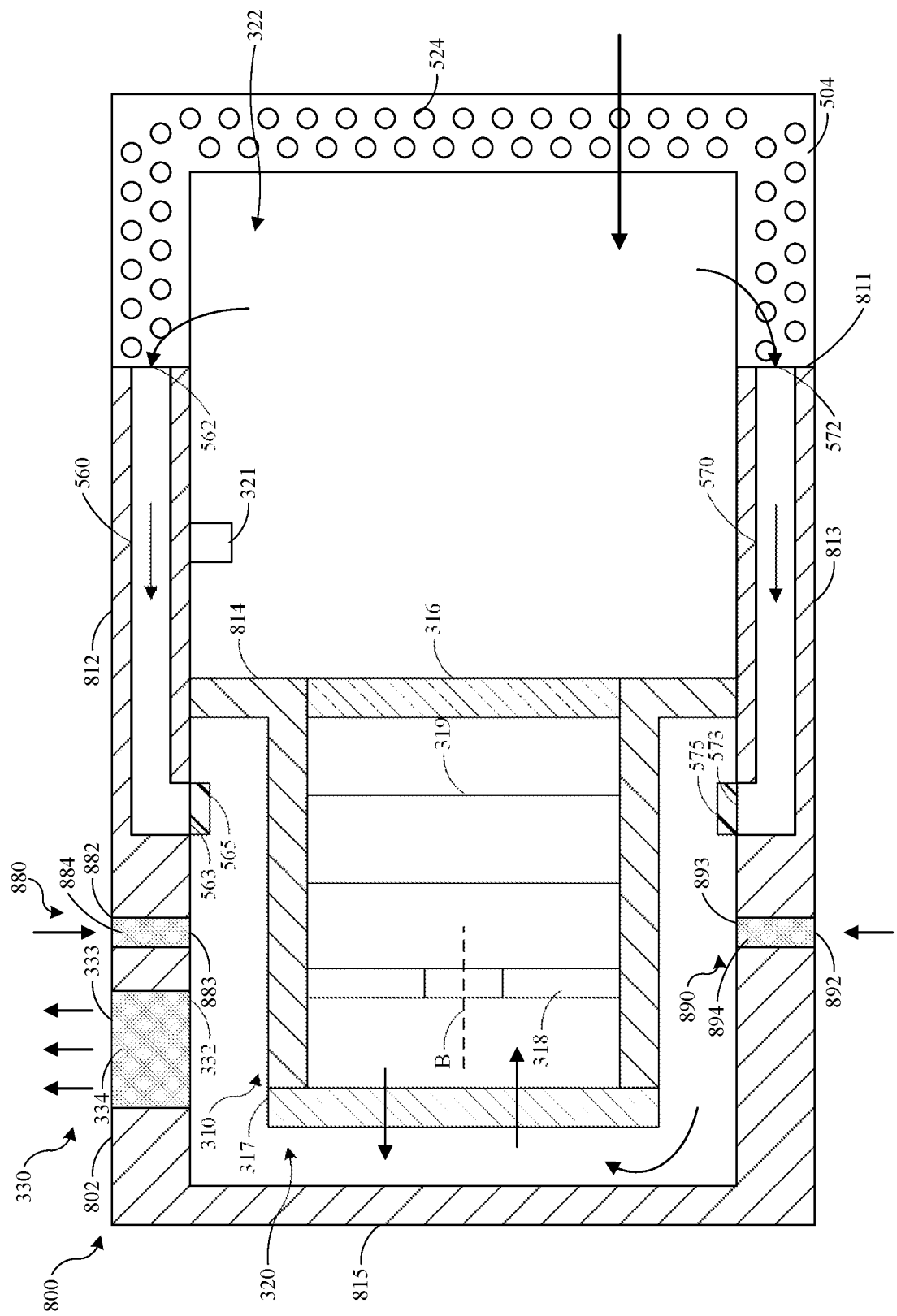
FIG. 9 is a side cross-section view illustration of the head-mounted display of FIG. 1 taken along line A-A of FIG. 3, according to a sixth implementation.

FIG. 9 is a side cross section view illustration of a head-mounted display 800 that is similar to the head-mounted display 500 discussed with respect to FIG. 6 except as described herein. The head-mounted display 800 includes a housing 802, a facial interface 504 including perforations 524 that is coupled to a rear portion 811 of the housing 802, an upper portion 812, a lower portion 813, a divider portion 814 extending between the upper portion 812 and the lower portion 813, and a front portion 815. The head-mounted display 800 also includes lenses 316, display 317, electronic components 319, the component chamber 320, the sensors 321, and the eye chamber 322, all of which are analogous to similarly designated components of the head-mounted display 500.

Similar to the head-mounted display 500, the head-mounted display 800 includes the upper passage 560 and the lower passage 570 to enable air flow from the facial interface 504 and the component chamber 320. The thermal regulation components of the head-mounted display 600 include the fan 318, which is operated and controlled as described with respect to the head-mounted display 100, and the exhaust vent 330. The thermal regulation components of the head-mounted display 800 also include the valve 565 configured to regulate air flow through the upper passage 560 and the valve 575 configured to regulate air flow through the lower passage 570.

The thermal regulation components of the head-mounted display 800 also include an upper housing vent 880 and a lower housing vent 890. The upper housing vent 880 extends through the upper portion 812 of the housing 802 and includes an inlet 882 to, upon operation of the fan 318, draws air from the environment into the component chamber 320. The inlet 882 may be formed as an opening in the upper portion 812. The upper housing vent 880 also includes an outlet 883 in direct communication with the component chamber 320 to dispel air received from the environment into the component chamber 320. The outlet 883 may be similarly formed as an opening in the upper portion 812 of the housing 802. The air dispelled into the component chamber 320 through the upper housing vent 880 is circulated throughout the component chamber 320 by the fan 318 to assist with cooling the components of the optical module assembly 310 including the electronic components 319 and is expelled from the housing 802 via the exhaust vent 330.

As shown in FIG. 9, in various implementations, a filter 884 is positioned within the upper housing vent 880 between the inlet 882 and the outlet 883. The filter 884 is similar to the filter 334 and the filter 344 discussed herein and includes a layer of fabric or other filtering material to prevent dust or other foreign particles from entering the component chamber 320.

The lower housing vent 890 extends through the lower portion 813 of the housing 802 and includes an inlet 892 to draw air from the environment into the component chamber 320. The inlet 892 may be formed as an opening in the lower portion 813 of the housing 802. The lower housing vent 890 also includes an outlet 893 in direct communication with the component chamber 320 to dispel air received from the environment into the component chamber 320. The outlet 893 may be similarly formed as an opening in the lower portion 813 of the housing 802. The air drawn into the component chamber 320 through the lower housing vent 890 is circulated throughout the component chamber 320 by the fan 318 to assist with cooling the components of the optical module assembly 310 and is expelled from the housing 802 via the exhaust vent 330.

In some implementations, a filter 894 is positioned within the lower housing vent 890 between the inlet 892 and the outlet 893. The filter 894 is similar to the filter 334 and the filter 344 discussed herein and includes a layer of fabric or other filtering material to prevent dust or other foreign particles from entering the component chamber 320.

As discussed herein with respect to the head-mounted display 700, one or both of the upper housing vent 880 and the lower housing vent 890 may include electronically controlled or user-controlled fluid regulation components such as valve to regulate air flow into the component chamber 320.

Figure 10:
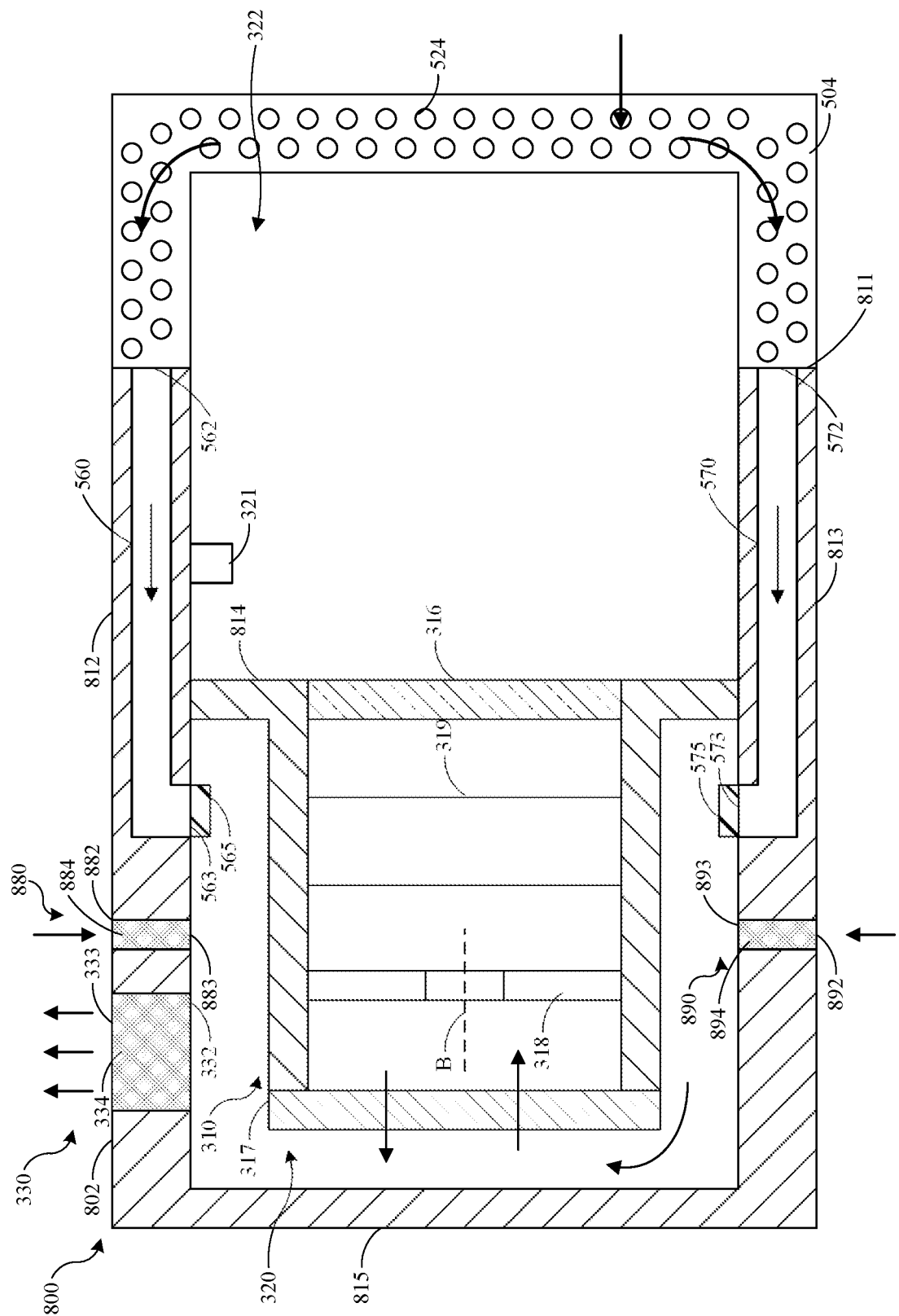
FIG. 10 is a side cross-section view illustration of the head-mounted display of FIG. 9 taken along line A-A of FIG. 3, illustrating a variation in air flow within the head-mounted display.

FIG. 10 is a side cross section view illustration of the head-mounted display 800 shown in FIG. 9, except the facial interface 504 is formed from a material that includes the perforations 524 to allow air into the facial interface 504 but air flow is not allowed into the eye chamber 322. As illustrated by the arrows that depict air movement within the head-mounted display 800, air flow passes into the facial interface 504 and is routed through the facial interface 504 to the upper passage 560 and the lower passage 570. In various implementations, the facial interface 504 is configured to permit air flow from the face 209 to provide the cooling effect described herein. However, the air flow does not pass through the facial interface 504 from the face 209 to the eye chamber 322. Instead, the air is routed through the facial interface 504 to the upper passage 560 and/or the lower passage 570 and into the component chamber 320 of the head-mounted display 800.

Figure 11:
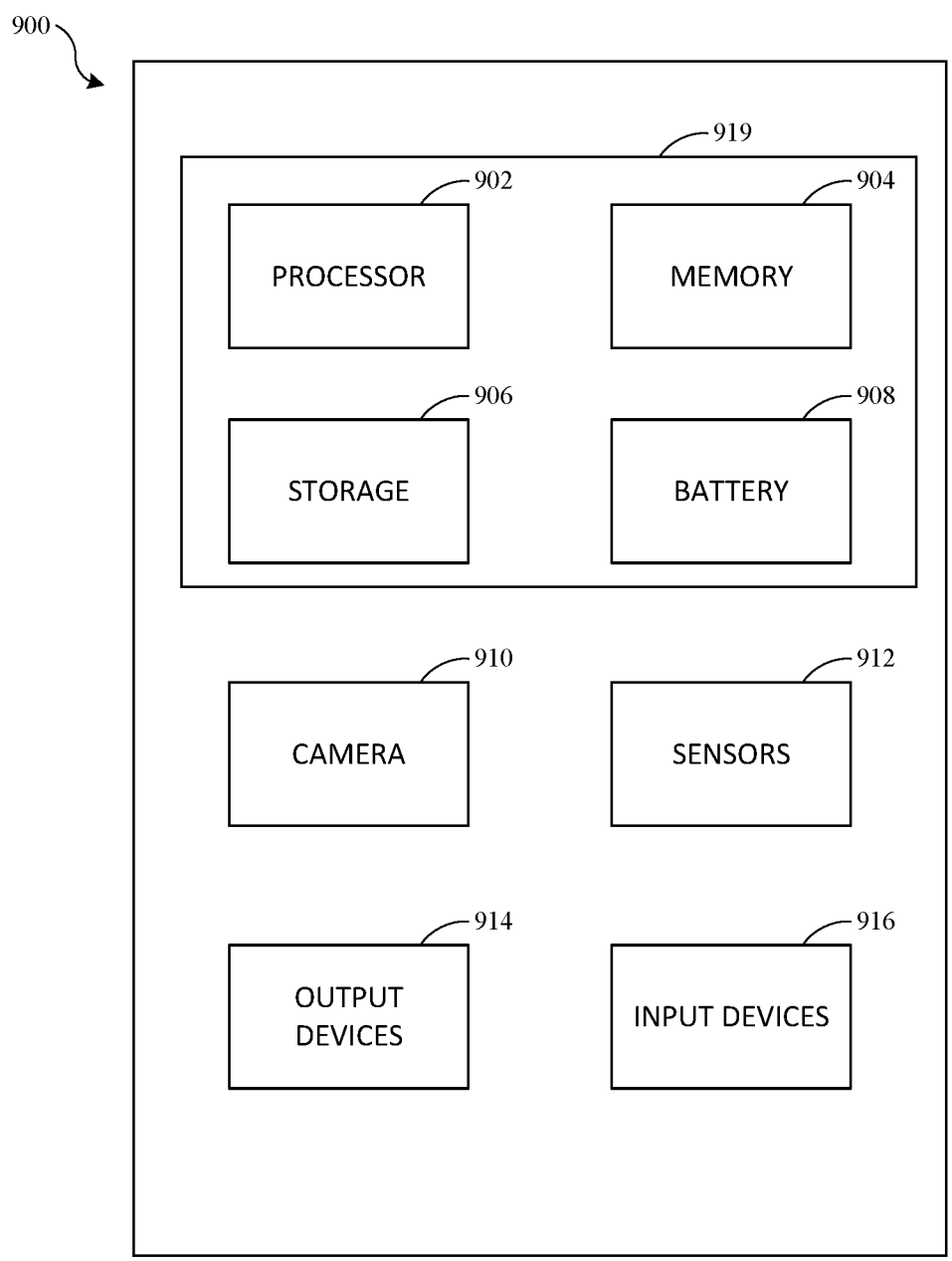
FIG. 11 is a schematic block diagram of a hardware configuration for electronic components of the head-mounted display of FIG. 1.

FIG. 11 is a block diagram that illustrates a hardware configuration for a head-mounted display 900 that includes electronic components 919, according to one implementation. The hardware configuration shown in FIG. 11 may be used by any of the head-mounted displays discussed herein. The electronic components 919 include a processor 902, memory 904, storage 906, and a battery 908. Additional hardware components of the head-mounted display 900 include a camera 910, sensors 912, output devices 914, and input devices 916. In various implementations, some or all of the electronic components 919 are implemented as a system on a chip.

The processor 902 is a conventional device such as a central processing unit or CPU, in some configurations, and is configured and operable to execute program instructions and perform operations described by the instructions. The memory 904 is a volatile and short-term information storage device such as a random access memory. The storage 906 is a non-volatile information storage device such as a hard drive. The battery 908 supplies power to the various components of the head-mounted display 900 including the electronic components 919, the camera 910, and the sensors 912. The battery 908 may be a rechargeable battery.

The camera 910 may include a single camera or multiple cameras positioned within or on the head-mounted display 900. The camera 910 is configured to capture images of the environment surrounding the head-mounted display 900 or features of the face 209, such as images indicating perspiration, for example. The sensors 912 may be any type of sensor mounted within the head-mounted display 900 that are configured to detect characteristics or conditions within the head-mounted display 900, such as temperature and/or humidity conditions within the component chamber 320 and temperature and/or humidity conditions within the eye chamber 322, as discussed herein. The sensors 912 may include temperature sensors, humidity sensors, other biometric sensors, light sensors, and air flow sensors, for example and without limitation.

The output devices 914 include any device operable to provide information to the user, such as the display 317 discussed herein. The input devices 916 include any interface device operable to receive a user input, such as a button, switch, toggle, touchscreen input, gestural input, or audio input.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create three-dimensional or spatial audio environment that provides the perception of point audio sources in three-dimensional space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationary with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer-generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mounted system may have one or more speaker(s) and an integrated opaque display. Alternatively, a head-mounted system may be configured to accept an external opaque display (e.g., a smartphone). The head-mounted system may incorporate one or more imaging sensors to capture images or video of the physical environment, and/or one or more microphones to capture audio of the physical environment. Rather than an opaque display, a head-mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

As described above, one aspect of the present technology is the gathering and use of data available from various sources to improve thermal regulation of a head-mounted device to improve thermal comfort during use of the head-mounted device. As an example, such data may identify the user and include user-specific settings or preferences. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, a user profile may be established that stores thermal preference related information that can be used to adjust operation of the head-mounted display according to user preferences. Accordingly, use of such personal information data enhances the user's experience.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of storing a user thermal preference profile, the present technology can be configured to allow users to select to "opt in" or "opt out" of participation in the collection of personal information data during registration for services or anytime thereafter. In another example, users can select not to provide data regarding usage of specific applications. In yet another example, users can select to limit the length of time that application usage data is maintained or entirely prohibit the development of an application usage profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, thermal regulation preferences may be determined each time the head-mounted display is used, such as by requesting user input and without subsequently storing the information or associating with the particular user.

What is claimed is:

1. A head-mounted display configured to be worn on a face, comprising:
   a housing;
   a facial interface comprising a porous structure having a plurality of perforations, the facial interface coupled to a rear portion of the housing and configured to engage with the face;
   a component chamber defined in the housing;
   a passage formed in the housing, the passage having an inlet adjacent to the facial interface and an outlet positioned adjacent to the component chamber to enable an air flow between the facial interface and the component chamber; and a fan located in the component chamber and configured to create the air flow from the face through the facial interface, wherein the air flow is directed within the facial interface to the passage formed in the housing.

2. The head-mounted display of claim 1, wherein the fan directs the air flow out of the housing via an opening in an upper portion of the housing.

3. The head-mounted display of claim 1, the housing including an eye chamber and a divider that separates the component chamber from the eye chamber, wherein the facial interface is configured such that the air flow through the facial interface does not pass through the facial interface to the eye chamber.

4. The head-mounted display of claim 1, wherein the passage includes a flow regulating component positioned in the passage and configured to regulate an amount of the air flow through the passage from the facial interface to the component chamber.

5. The head-mounted display of claim 4, wherein the flow regulating component is adjustable between an open position and a closed position by an input device.

6. The head-mounted display of claim 1, wherein operation of the fan is configured to create a negative pressure at the facial interface to provide evaporative cooling on the face.

7. The head-mounted display of claim 1, wherein operation of the fan is configured to provide evaporative cooling on the face.

8. The head-mounted display of claim 1, wherein the air flow between the facial interface and the component chamber does not pass through an eye chamber defined in the housing.

9. A head-mounted display configured to be worn on a face, comprising:
   a housing;
   an eye chamber defined by the housing;
   a component chamber defined by the housing and separated from the eye chamber by a divider wall;
   a face seal having a cover, wherein openings are formed through the cover to allow airflow through the face seal; and
   a fan located in the component chamber and configured to draw air into the face seal such that the air is routed through the face seal and from the face seal into the component chamber through an inlet formed in the housing adjacent to the face seal.

10. The head-mounted display of claim 9, wherein the housing further includes an exhaust vent in an upper portion of the housing and the fan draws air from the face seal into the component chamber and out the exhaust vent.

11. The head-mounted display of claim 9, wherein the housing includes a passage that extends from the inlet to an outlet that is adjacent to the component chamber.

12. The head-mounted display of claim 11, wherein the passage includes a flow regulating component configured to regulate a flow of air between the face and the component chamber through the face seal.

13. The head-mounted display of claim 12, wherein the flow regulating component is adjustable between an open position and a closed position by an input device.

14. The head-mounted display of claim 12, wherein the housing further includes a sensor and the flow regulating component is adjustable between an open position and a closed position based on data from the sensor.

15. The head-mounted display of claim 9, wherein operation of the fan is controlled based on an air temperature in the eye chamber.

16. The head-mounted display of claim 9, wherein operation of the fan is controlled based on a humidity level of the eye chamber.

17. The head-mounted display of claim 9, wherein the air passes from the face seal to the component chamber without passing into the eye chamber.

18. A head-mounted display configured to engage with a face, comprising: a housing that defines an eye chamber; a porous interface coupled to the housing and configured to engage with the face; and a fan located within the housing that is configured to create a negative pressure against the face by drawing air from the face and the porous interface, wherein the air is routed through the porous interface into the housing without passing the eye chamber.

19. The head-mounted display of claim 18, wherein operation of the fan is controlled based on a skin temperature of the face.

20. The head-mounted display of claim 18, wherein the housing defines a component chamber including a display and the fan is operable to create air flow from the porous interface into the component chamber to circulate air within the component chamber.

* * * * *